United States Patent [19]
Bernstein

[11] Patent Number: 6,028,389
[45] Date of Patent: Feb. 22, 2000

[54] MICROMACHINED PIEZOELECTRIC TRANSDUCER

[75] Inventor: Jonathan J. Bernstein, Medfield, Mass.

[73] Assignee: The Charles Stark Draper Laboratory, Inc., Cambridge, Mass.

[21] Appl. No.: 09/084,142

[22] Filed: May 26, 1998

[51] Int. Cl.[7] ............................................. H01L 41/08
[52] U.S. Cl. ................................. 310/324; 310/311
[58] Field of Search ...................... 310/311, 328, 310/324

[56] References Cited

U.S. PATENT DOCUMENTS

| | | | |
|---|---|---|---|
| 5,162,691 | 11/1992 | Mariani et al. | 310/321 |
| 5,767,612 | 6/1998 | Takeuchi et al. | 310/324 |
| 5,801,476 | 9/1998 | Sturzebecher et al. | 310/324 |

*Primary Examiner*—Thomas M. Dougherty
*Attorney, Agent, or Firm*—Iandiorio & Teska

[57] ABSTRACT

A micromachined piezoelectric acoustic transducer includes a substrate; at least one piezoelectric actuator means attached at at least one proximal edge to the substrate; a gap around at least a portion of the remaining edges of the piezoelectric actuator means; and a flexible corrugated membrane in at least a portion of the gap and interconnecting the actuator means with at least one of the substrate or a neighboring actuator means.

15 Claims, 7 Drawing Sheets

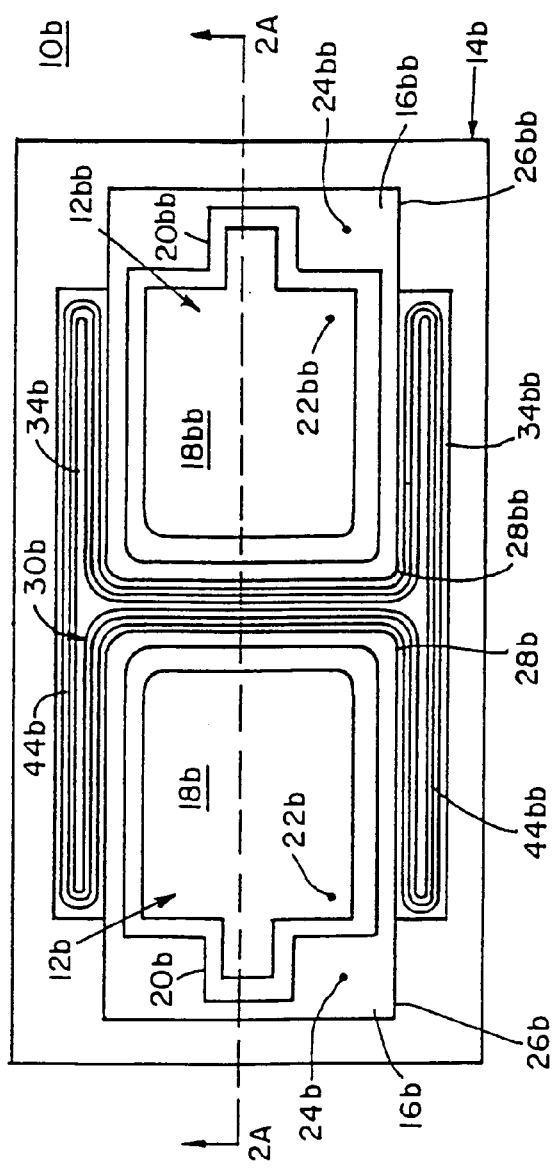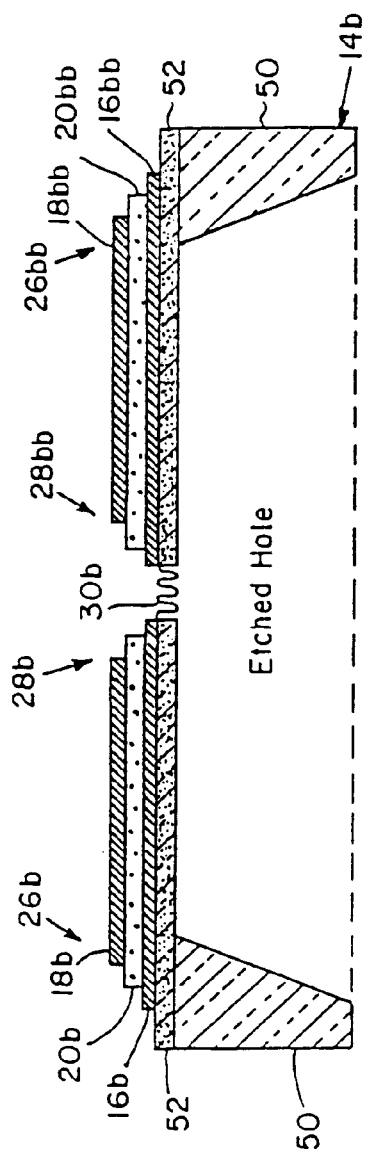

MICROMACHINED PIEZOELECTRIC TRANSDUCER

FIELD OF INVENTION

This invention relates to an improved micromachined piezoelectric acoustic transducer.

BACKGROUND OF INVENTION

Conventional acoustic transducers, especially those used in hearing aids, strive for wide bandwidth and high efficiency which are also desirable attributes of good microphones. Presently these functions are performed by electrodynamic and magnetic speakers and microphones. Another approach is to use piezoelectric cantilevers to convert from electrical to acoustical energy and vice versa. Electrodynamic and magnetic transducers are very energy inefficient. In battery powered applications such as hearing aids, this represents major power consumption and limits battery life. Piezoelectric microphones have the disadvantage of high mechanical Q, resulting in good sensitivity only in a narrow band at resonance and low sensitivity elsewhere. Most applications for microphones and speakers prefer a wide audio bandwidth with no sharp peaks in the frequency response, hence the piezoelectric transducers are typically inadequate. One method uses a single, flat cantilever of relatively thick layers of silicon nitride and zinc oxide as the transducer. The stresses in the cantilever structure result in a curved diaphragm with wide gaps around the edges. These wide gaps result in poor low frequency performance, making the transducer a poor choice for miniature microphone applications. Another method uses a continuous membrane of high stress and great thickness covered with a thick piezoelectric film. The high stress results in low sensitivity, while the thick membrane (total thickness of several microns) results in a high Q and unacceptable peaks in the frequency response.

SUMMARY OF INVENTION

It is therefore an object of this invention to provide an improved, micromechanical piezoelectric acoustic transducer.

It is a further object of this invention to provide such an acoustic transducer that has better low frequency response.

It is a further object of this invention to provide such an acoustic transducer that has low mechanical Q, wide band width and good linearity even with large deflections.

It is a further object of this invention to provide such an acoustic transducer that has increased efficiency.

It is a further object of this invention to provide such an acoustic transducer that has lower mass and higher sensitivity.

The invention results from the realization that a truly improved piezoelectric acoustic transducer can be achieved with a thin piezoelectric actuator supported from at least one edge by a substrate with a gap surrounding the actuator and a low mass flexible corrugated membrane in the gap and extending between the actuator and the surrounding substrate and/or neighboring actuators thereby reducing the mass and mechanical Q of the transducer and providing high sensitivity and wide bandwidth, and the further realization that the flexible corrugated membrane and any stiff piston portion can be made by the same micromachining technique by varying the spacing of the corrugated membrane undulations.

This invention features a micromachined piezoelectric acoustic transducer including a substrate and at least one piezoelectric actuator means attached at at least one proximal edge to the substrate. There is a gap around at least a portion of the remaining edges of the piezoelectric actuator means and a flexible corrugated membrane in at least a portion of the gap and interconnecting the actuator means with at least one of the substrate or a neighboring actuator means.

In a preferred embodiment there may be at least two piezoelectric actuator means, each attached along its proximal edge to the substrate. A portion of the gap may extend between the actuator means and the corrugated membrane may extend in the gap between the actuator means. There may be a plurality of actuator means and a stiff piston section. The proximal edge of the actuator means may be attached to the substrate. At least a portion of the distal edges may be attached to the piston section. The gap may extend between each actuator means and the substrate and each actuator means and the piston section. The corrugated membrane may extend in the gap and be interconnected between each actuator means and the piston or between each actuator means and the substrate. The piston section may be centrally disposed with the substrate peripherally about it and the actuator means and the corrugated membrane extending arcuately circumferentially. There may be a plurality of actuator means. The proximal end of each of the actuator means may be attached to the substrate and the distal edge may be juxtaposed across the gap from neighboring actuator means and may be interconnected with the neighboring actuator means by the corrugated membrane. The piezoelectric actuator may be a monomorph or a bimorph. The corrugated membrane may extend generally parallel to the edge of the actuator means. The corrugated membrane undulations may be spaced and define a flexible bellows. The stiff piston section may include a corrugated layer in which adjacent undulations are in contact and fixed together to form a rigid member. The piezoelectric actuator may be made of a ferroelectric material, an electrostrictive material or a piezoelectric material.

DISCLOSURE OF PREFERRED EMBODIMENT

Other objects, features and advantages will occur to those skilled in the art from the following description of a preferred embodiment and the accompanying drawings, in which:

FIG. 2 is a diagrammatic top plan view of a piezoelectric transducer similar to that shown in FIG. 1 but with the corrugated membranes extending throughout the entire gap;

FIG. 2A is a sectional view taken along lines 2A—2A of FIG. 2;

FIGS. 5A–F are diagrammatic side elevational sectional views showing the method of micromachining a corrugated membrane having both flexible and stiff regions; and FIGS. 6A–D are schematics of various two-dimensionally micromachinable patterns of corrugated membranes for creating stiff regions.

Figure 1:
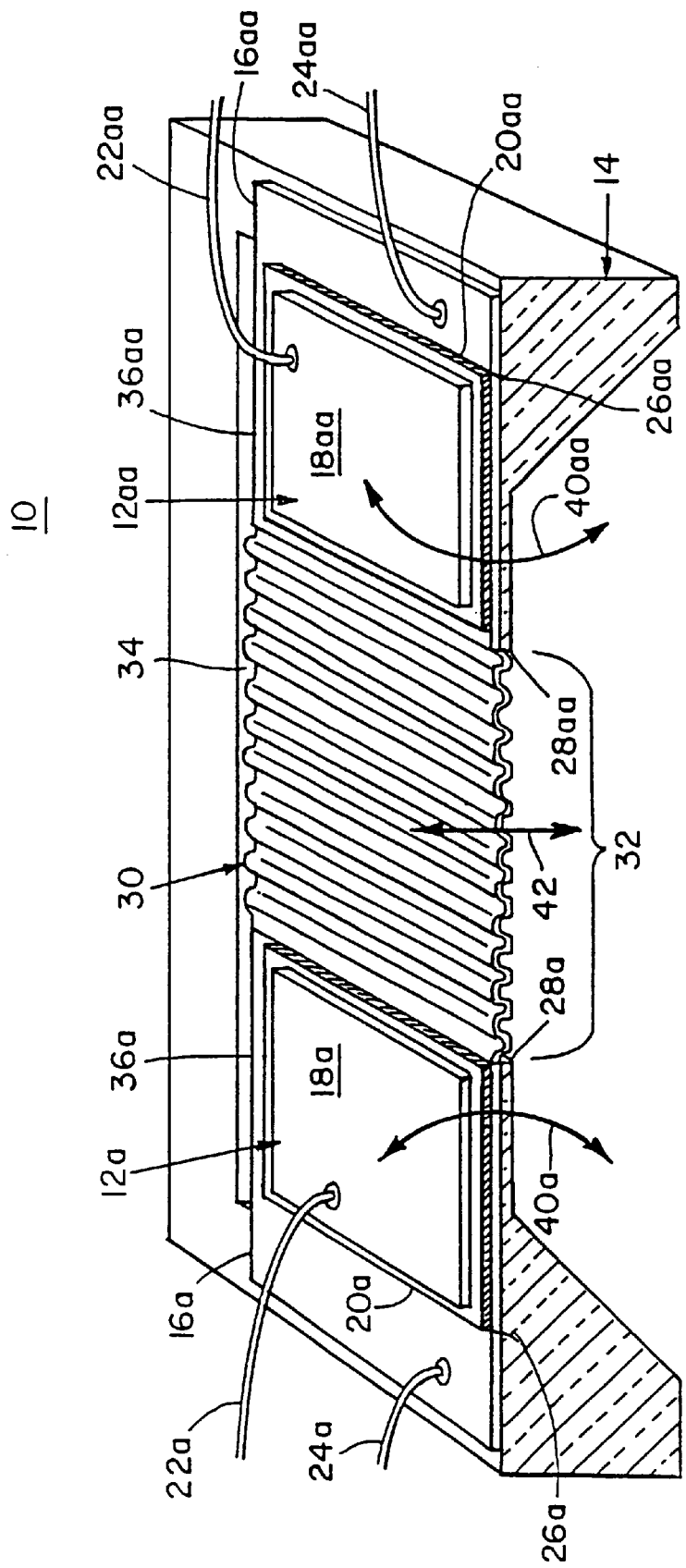
FIG. 1 is a three-dimensional sectional view of a micromachined piezoelectric transducer according to this invention with an open gap.

There is shown in FIG. 1 a micromachined piezoelectric transducer 10 according to this invention which includes two actuator means 12a and 12aa mounted on substrate 14. Each actuator includes a bottom conductor 16a, 16aa and a top conductor 18a, 18aa with a piezoelectric element 20a, 20aa between them. Electrical leads 22a, 22aa, 24a and 24aa are wire bonded to their respective conductors. The proximal ends 26a, 26aa are mounted on substrate 14 while the distal edges 28a, 28aa are interconnected with corrugated diaphragm or membrane 30 that extends between them in slot, window or gap 32. A portion 34 of gap 32 extends along the remaining distal edges 36a and 36aa of actuator means 12a and 12aa but there is no corrugated membrane in slot, window or gap portion 34. When electrical power is applied to leads 22a, 22aa, 24a and 24aa, actuator means 12a and 12aa move in the direction indicated by arrows 40a and 40aa, and are permitted to do so because of the flexibility of corrugated membrane 30 which can move in the direction of arrow 42. Conversely, if a pressure wave or acoustic wave or elastic wave occurs to move actuator means 12a and 12aa in the direction of arrow 40a and 40aa, a voltage is generated across the respective leads 22a, 24a and 22aa, 24aa.

One of the benefits of the use of corrugated membrane 30 is that it preserves the flexibility of movement of actuator means 12a and 12aa while closing the gap which would allow pressure leakage or bleeding from one side of the transducer to the other. The full benefit of this can be achieved in an embodiment such as FIG. 2 where transducer 10b is shown with the corrugated membranes 30 extending not just in the portion between the distal ends 28b, 28bb of actuator means 12b and 12bb, but also in the side portions 34b, 34bb where there are corrugated membranes 44b and 44bb. The construction of transducer 10b can be seen in more detail in sectional view FIG. 2A where substrate 14 is depicted as including a silicon base 50 with a boron doped silicon layer 52 on top.

Figure 3:
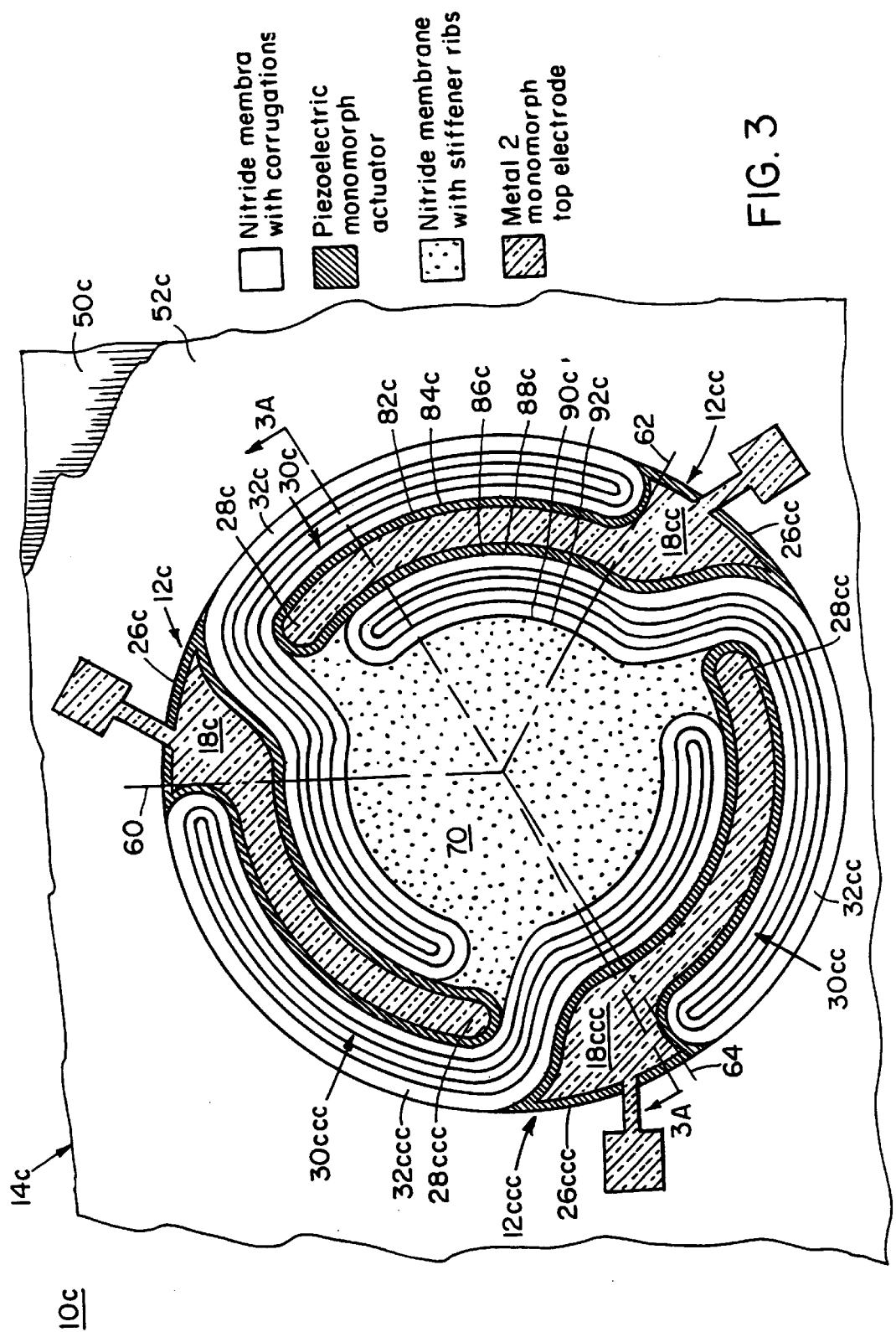
FIG. 3 is a top plan view of another piezoelectric transducer according to this invention which is rotationally symmetrical and uses three transducers and a stiff piston.
Figure 3A:
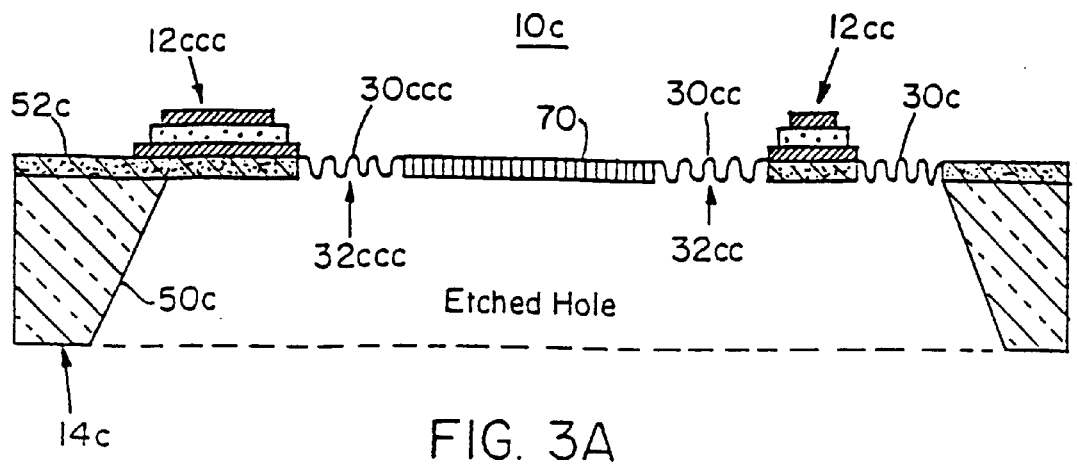
FIG. 3A is a sectional view taken along lines 3A—3A of FIG. 3.
Figure 6A:
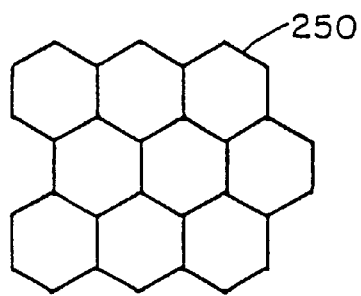
Figure 6B:
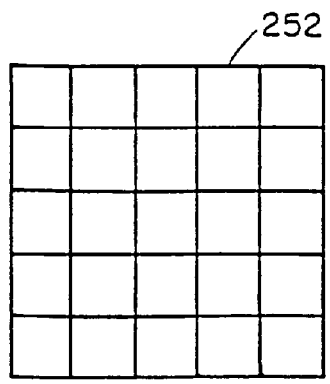
Figure 6C:
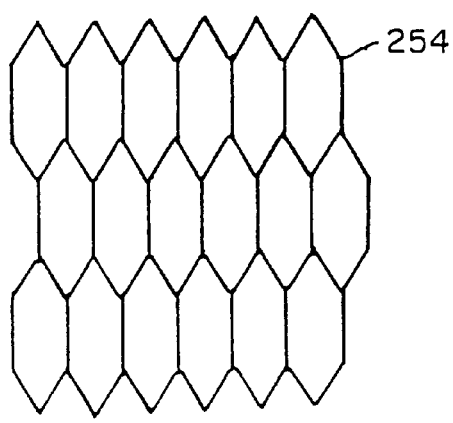
Figure 6D:
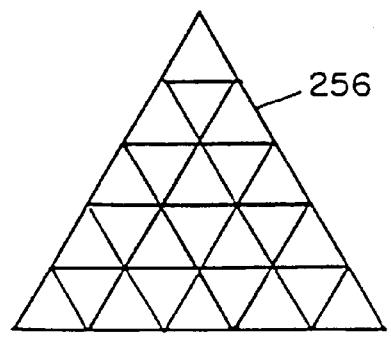

In another construction transducer 10c is mounted on substrate 14c which includes silicon base 50c and boron doped silicon layer 52c. There are three actuator means 12c, 12cc, 12ccc arranged in threefold rotational symmetry as indicated by symmetry lines 60, 62 and 64. Each of actuator means 12c, 12cc, 12ccc has its proximal end 26c, 26cc, 26ccc mounted to substrate 14c and then extends generally arcuately and terminates at its distal 28c, 28cc, 28ccc where it is attached to stiff piston section 70. There are three sets of corrugated membranes 30c, 30cc, 30ccc, each of which extends across the associated gap 32c, 32cc, 32ccc. For example, corrugated membrane 30c has its outer edge 80c interconnected with substrate 14c and its inner edge 82c connected with the outer edge 84c of actuator means 12cc. The inner edge 86c of actuator means 12cc interconnects with the outer edge 88c of corrugated membrane 32cc and the inner edge 90c of corrugated membrane 32cc engages with a portion of the edge 92c of stiff piston region 70. In this way, when an electric voltage is applied across actuators 12c, 12cc and 12ccc their distal ends 28c, 28cc, 28ccc will bend upward or downward into the plane of the paper or out of it moving stiff region 70 with them. Or, conversely, when stiff region 70 is moved into or out of the plane of the paper it will move the distal ends 28c, 28cc, 28ccc of actuator means 12c, 12cc, 12ccc and create a voltage across the actuator. The construction of transducer 10c, FIG. 3, can be seen in greater detail in FIG. 3A.

Figure 4:
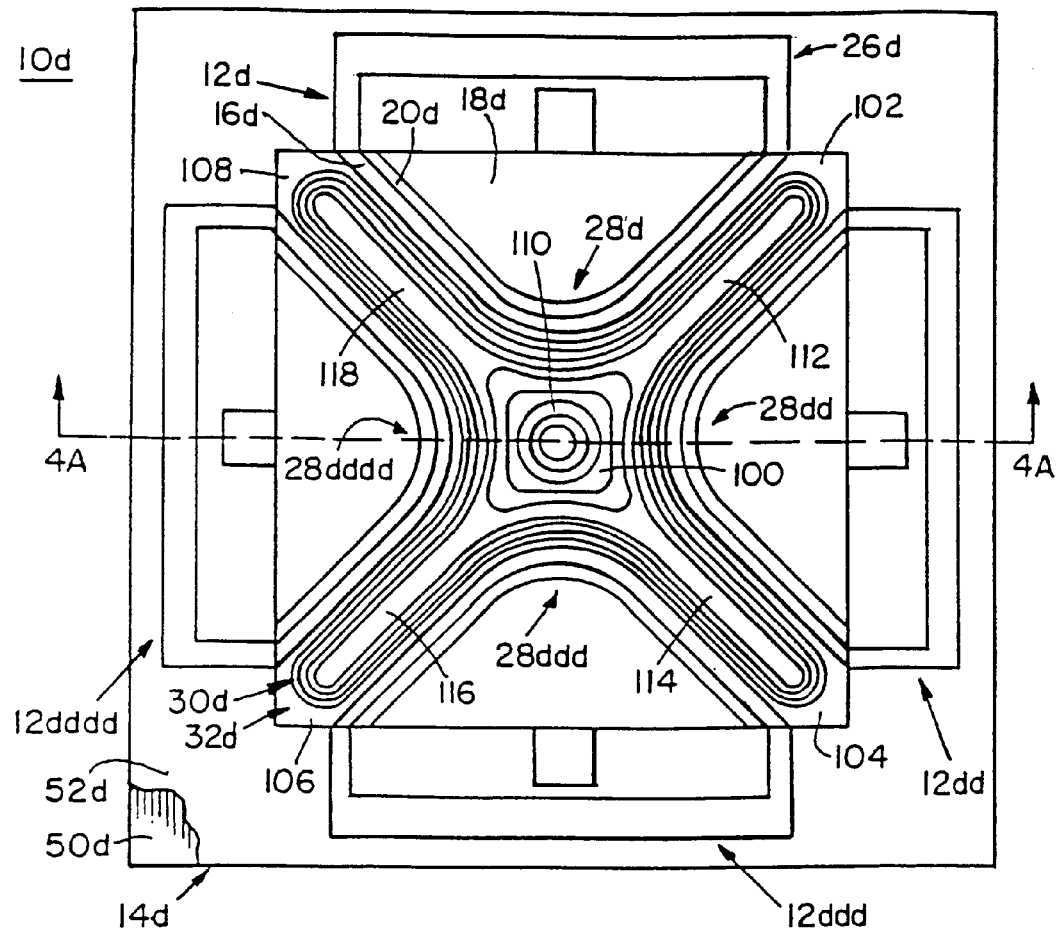
FIG. 4 is a diagrammatic top plan view of a piezoelectric transducer according to this invention having fourfold symmetry.
Figure 4A:
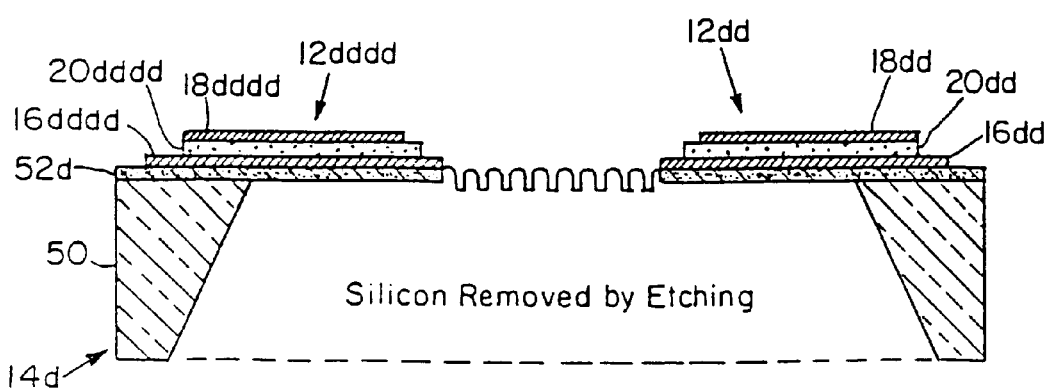
FIG. 4A is a sectional view taken along line 4A—4A of FIG. 4.

In another construction, FIGS. 4, 4A, a fourfold symmetrical transducer 10d includes four actuator means 12d, 12dd, 12ddd, 12dddd with a corrugated membrane 30d that is disposed in gap 32d. Gap 32d has a center portion 100 and four arms 102, 104, 106 and 108 in which are located a center portion 110 and four legs 112, 114, 116 and 118 of corrugated membrane 30d. When the distal ends 28d, 28dd, 28ddd and 28dddd are driven into or out of the plane of the paper either by the application of a voltage potential across the actuator means or by an elastic or an acoustic wave, those distal ends are free to move because of the flexibility of the corrugated membrane.

The actuators herein have been referred to as having piezoelectric layers, but this is not a necessary limitation as the phrase piezoelectric herein is used to include not just piezoelectric materials but the similar ferroelectric and electrostrictive materials that perform the same function. Any one of the embodiments in FIGS. 1–4A may be made with a ferroelectric, electrostrictive or piezoelectric material to the same end. Furthermore, the particular construction can be either a monomorph or a bimorph as will be understood by those skilled in the art. It should also be understood that while in the particular embodiment shown the corrugated membranes run generally parallel to the edges of the actuator means, this is not a necessary limitation of the invention as they may be transverse to those edges or even perpendicular to them. The corrugated membrane which provides the flexibility to the actuator means while closing the gaps can be conveniently made as can the stiffened piston section shown in FIGS. 3 and 3A by an innovative method shown and described with respect to FIGS. 5A–F.

Figure 5A:
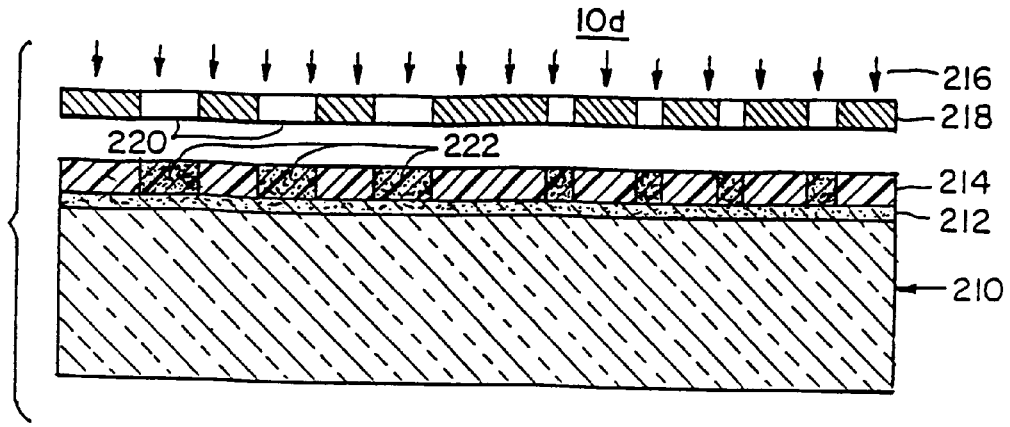
Figure 5B:
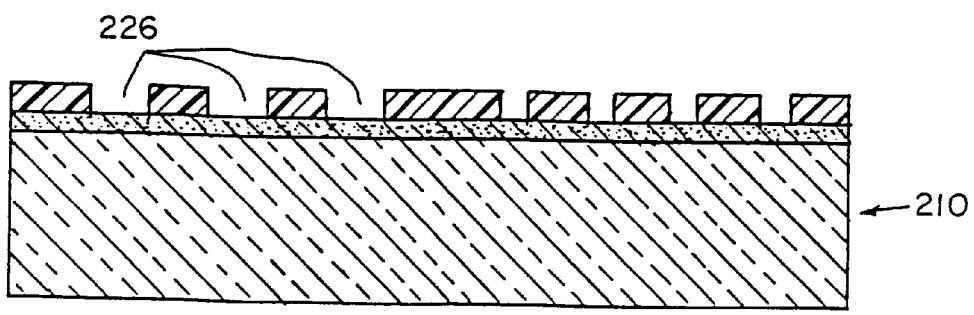
Figure 5C:
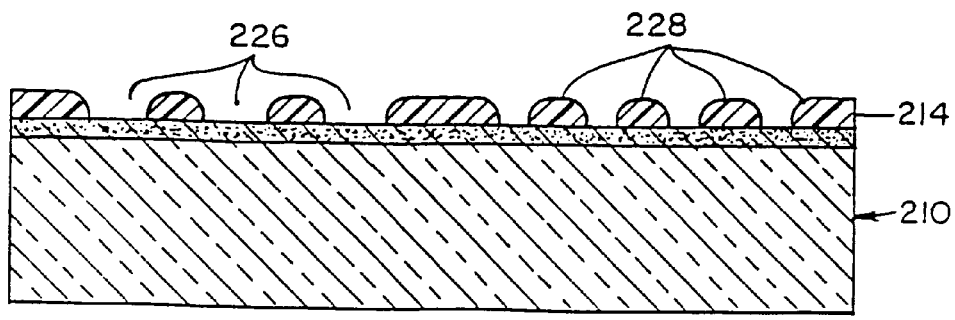
Figure 5D:
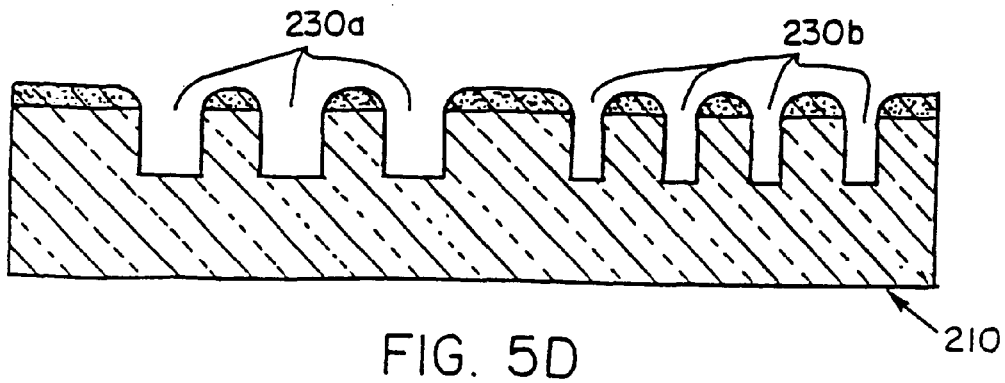
Figure 5E:
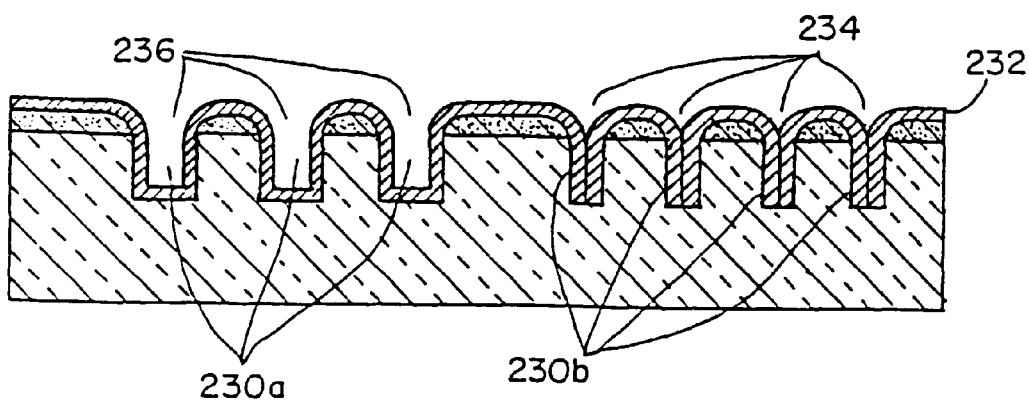
Figure 5F:
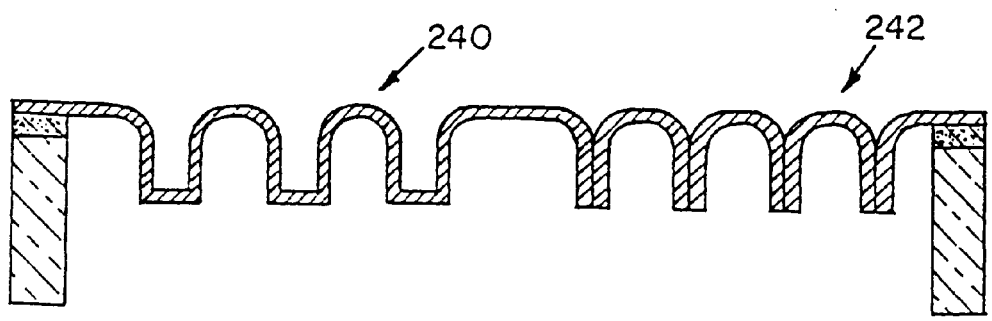

There is shown in FIG. 5A a starting substrate 210 which may be made of silicon with a boron doped silicon region 212 on the top surface. A positive photoresist 214 such as phenyl formaldehyde or Novalac resins, or negative photoresist such as rubber, is spun or otherwise deposited on the top of substrate 210. Prebaking is then effected at typically from two to thirty minutes at 90–100° C. in order to drive off solvents and other impurities. Then photoresist 214 is exposed to ultraviolet light 216 through a mask 218. Ultraviolet light 216 passes through holes 220 in mask 218, striking the photoresist 214 at corresponding portions 222. Substrate 210 is then subjected to a developer, FIG. 5B, so that the portions 222 are removed, leaving in their place grooves 226. A post bake may now be done for two to thirty minutes at 120–140° C. to round the edges as shown at 228 in FIG. 5C so that the ultimate corrugations will have a rounded configuration. Following this a reactive ion etch, FIG. 5D, is effected to create two sets of grooves 230a, 230b into the silicon substrate 210. The etching may be done in a vacuum of 0.1 to 10 millitorrs at a rate of 0.1 to 1.0 $\mu$ per minute. The grooves are formed so that the larger grooves 230a in the flexible section are at least twice the width of the narrower grooves 230b in the stiff section. Next, the grooves 230a and 230b are coated with a coating 232 such as silicon nitride or silicon carbide, FIG. 5E, to a thickness of 0.1 to $1\mu$. The grooves 230b should have a width which is less than twice the thickness of the coating. Grooves 230a should in comparison have a width which is greater in width than twice the thickness of coating 232. Thus for example, if a coating of $0.4\mu$ was deposited the narrow grooves 230b should have a width of $0.8\mu$ or less so that the coatings will contact as at 234 and form a unitary rigid body. Grooves 230a on the other hand should be greater in width than $0.8\mu$ so there will be substantial space 236 between them whereby the desired flexibility is attained. Typically the coating can be deposited by a CVD technique, Chemical Vapor Deposition. Following this, as depicted in FIG. 5F, the second etch can be done to remove the silicon substrate from the corrugations which have been formed by the coating 232. This leaves a series of wide flexible corrugations 240 and narrow stiff corrugations 242 which actually contact each other. This etching can be done using an anisotropic etch agent such as ethylene diamine pyrocatechol.

Although thus far the explanation of the corrugations has used an example of one-dimensional corrugations, this is not a necessary limitation of the invention, as two-dimensional corrugations may be used to improve the rigidity of the stiff corrugated regions. As shown in FIGS. 6A–D, by way of illustration and not limitation, various types of honeycomb constructions can be effected using this technique, such as hexagonal honeycomb structure 250, FIG. 6A, square honeycomb 252, FIG. 6B, elongated hexagonal honeycomb 254, FIG. 6C, and triangular honeycomb 256, FIG. 6D.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A micromachined piezoelectric acoustic transducer comprising:
   a substrate;
   at least one piezoelectric actuator means, having at least one proximal edge and at least one remaining distal edge, attached at at least one proximal edge to said substrate;
   a gap between at least a portion of the remaining distal edges of said piezoelectric actuator means and at least one of said substrate or neighboring actuator means; and
   a flexible corrugated membrane in at least a portion of said gap and interconnecting said actuator means with at least one of said substrate or neighboring actuator means.

2. The micromachined piezoelectric acoustic transducer of claim 1 in which there are at least two piezoelectric actuator means each attached along its proximal edge to said substrate, a portion of said gap extends between said actuator means and said corrugated membrane extends in said gap between said actuator means.

3. The micromachined piezoelectric acoustic transducer of claim 1 in which there are a plurality of actuator means and a stiff piston section, the proximal edge of each said actuator means being attached to said substrate, at least a portion of the distal edges being attached to said piston section, said gap extending between each said actuator means, and said substrate and each said actuator means and said piston section, and said corrugated membrane extending in said gap and interconnected between each said actuator means and said piston and between each said actuator means and said substrate.

4. The micromachined piezoelectric acoustic transducer of claim 3 in which said piston section is centrally disposed with said substrate peripherally about it, and said actuator means and said corrugated membrane extend arcuately circumferentially.

5. The micromachined piezoelectric acoustic transducer of claim 1 in which there are a plurality of actuator means, the proximal edge of each said actuator means being attached to said substrate and the distal edge being juxtaposed across said gap from neighboring actuator means and being interconnected with said neighboring actuator means by said corrugated membrane.

6. The micromachined piezoelectric acoustic transducer of claim 1 in which said piezoelectric actuator is a monomorph.

7. The micromachined piezoelectric acoustic transducer of claim 1 in which said piezoelectric actuator is a bimorph.

8. The micromachined piezoelectric acoustic transducer of claim 1 in which the corrugations of said corrugated membrane extend generally parallel to the edge of said actuator means.

9. The micromachined piezoelectric acoustic transducer of claim 1 in which said corrugation undulations are spaced to define a flexible bellows.

10. The micromachined piezoelectric acoustic transducer of claim 3 in which said stiff piston section includes a corrugated layer having wide flexible corrugations and narrow rigid corrugations.

11. The micromachined piezoelectric acoustic transducer of claim 1 further including a stiff piston section interconnected with at least a portion of said actuator means.

12. The micromachined piezoelectric acoustic transducer of claim 11 in which said stiff piston section includes a corrugated layer having wide flexible corrugations and narrow rigid corrugations.

13. The micromachined piezoelectric acoustic transducer of claim 1 in which said piezoelectric actuator means is made of a ferroelectric material.

14. The micromachined piezoelectric acoustic transducer of claim 1 in which said piezoelectric actuator means is made of an electrostrictive material.

15. The micromachined piezoelectric acoustic transducer of claim 1 in which said piezoelectric actuator means is made of a piezoelectric material.

* * * * *